United States Patent
Su et al.

(10) Patent No.: US 12,146,897 B2
(45) Date of Patent: Nov. 19, 2024

(54) VERTICAL PROBE CARD HAVING DIFFERENT PROBES

(71) Applicant: CHUNGHWA PRECISION TEST TECH. CO., LTD., Taoyuan (TW)

(72) Inventors: Wei-Jhih Su, Taichung (TW); Chao-Hui Tseng, New Taipei (TW); Hao-Yen Cheng, Taoyuan (TW); Mei-Hui Chen, Taoyuan (TW)

(73) Assignee: CHUNGHWA PRECISION TEST TECH. CO., LTD., Taoyuan (TW)

(*) Notice: Subject to any disclaimer, the term of this patent is extended or adjusted under 35 U.S.C. 154(b) by 223 days.

(21) Appl. No.: 17/980,534

(22) Filed: Nov. 3, 2022

(65) Prior Publication Data
US 2023/0314477 A1 Oct. 5, 2023

(30) Foreign Application Priority Data
Mar. 31, 2022 (TW) .................................. 111112373

(51) Int. Cl.
*G01R 1/02* (2006.01)
*G01R 1/04* (2006.01)
*G01R 1/067* (2006.01)
*G01R 1/073* (2006.01)
*G01R 3/00* (2006.01)
*G01R 31/20* (2006.01)
*G01R 31/28* (2006.01)

(52) U.S. Cl.
CPC ........... *G01R 1/07314* (2013.01); *G01R 1/04* (2013.01); *G01R 1/07364* (2013.01)

(58) Field of Classification Search
CPC . G01R 1/02; G01R 1/04; G01R 1/067; G01R 1/073; G01R 31/20; G01R 31/28; G01R 3/00
See application file for complete search history.

(56) References Cited

U.S. PATENT DOCUMENTS

| | | | |
|---|---|---|---|
| 2011/0050267 A1* | 3/2011 | Pagani | G01R 1/18 324/756.03 |
| 2018/0011126 A1* | 1/2018 | Acconcia | G01R 1/06733 |
| 2019/0212367 A1* | 7/2019 | Hsieh | G01R 1/07357 |
| 2023/0028352 A1* | 1/2023 | Vallauri | G01R 1/07357 |

* cited by examiner

*Primary Examiner* — Neel D Shah
(74) *Attorney, Agent, or Firm* — Li & Cai Intellectual Property Office

(57) ABSTRACT

A vertical probe card having different probes is provided, and includes a first guiding board unit, a second guiding board unit, and a plurality of fence-like probes passing through the first and the second guiding board units. Each of the fence-like probes has a probe length within a range from 5 mm to 8 mm, and includes a fence-like segment, a connection segment, and a testing segment. The fence-like segment includes a penetrating slot having a length greater than 65% of the probe length. The fence-like segment includes two arms respectively arranged at two opposite sides of the penetrating slot and spaced apart from each other by an adjustment distance within a range from 10 μm to 120 μm. The fence-like probes include a first probe and a second probe, which have a same contact force and are configured to respectively meet different electrical transmission requirements.

9 Claims, 16 Drawing Sheets

VERTICAL PROBE CARD HAVING DIFFERENT PROBES

CROSS-REFERENCE TO RELATED PATENT APPLICATION

This application claims the benefit of priority to Taiwan Patent Application No. 111112373, filed on Mar. 31, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a vertical probe card having different probes.

BACKGROUND OF THE DISCLOSURE

Conductive probes of a conventional vertical probe card are designed to have a same structure such as to have the same properties. Accordingly, when a device under test (DUT) has different electrical testing requirements, different types of the conventional vertical probe cards will need to be used to meet said requirements, despite the testing time of the DUT being extended as a consequence.

SUMMARY OF THE DISCLOSURE

In response to the above-referenced technical inadequacies, the present disclosure provides a vertical probe card having different probes to effectively improve on the issues associated with conventional vertical probe cards.

In one aspect, the present disclosure provides a vertical probe card having different probes, which includes a first guiding board unit, a second guiding board unit that is spaced apart from the first guiding board unit, and a plurality of fence-like probes that pass through the first guiding board unit and the second guiding board unit. Each of the fence-like probes has a probe length within a range from 5 mm to 8 mm, and each of the fence-like probes includes a fence-like segment, a connection segment, and a testing segment. The fence-like segment has an elongated shape defining a longitudinal direction. The fence-like segment includes a penetrating slot formed along the longitudinal direction and having a length greater than 65% of the probe length. The fence-like segment includes two arms that are respectively arranged at two opposite sides of the penetrating slot and that are spaced apart from each other by an adjustment distance within a range from 10 μm to 120 μm. The connection segment and the testing segment are respectively connected to two end portions of the fence-like segment and respectively pass through the first guiding board unit and the second guiding board unit. The fence-like probes have a same contact force and include a first probe and a second probe. The first probe and the second probe are configured to respectively meet different electrical transmission requirements, a minimum cross-sectional area of the fence-like segment of the first probe is equal to a minimum cross-sectional area of the fence-like segment of the second probe, and a shape of the penetrating slot of the first probe is different from a shape of the penetrating slot of the second probe.

Therefore, in the vertical probe card provided by the present disclosure, the fence-like probes have structural designs that can allow the penetrating slots to change their shape within the adjustment distance to meet different electrical transmission requirements (e.g., through having the probe length being within a range from 5 mm to 8 mm, the length of the penetrating slot being greater than 65% of the probe length, and the minimum cross-sectional area of the fence-like segment of the first probe being equal to that of the second probe), thereby effectively decreasing the testing time of the vertical probe card.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
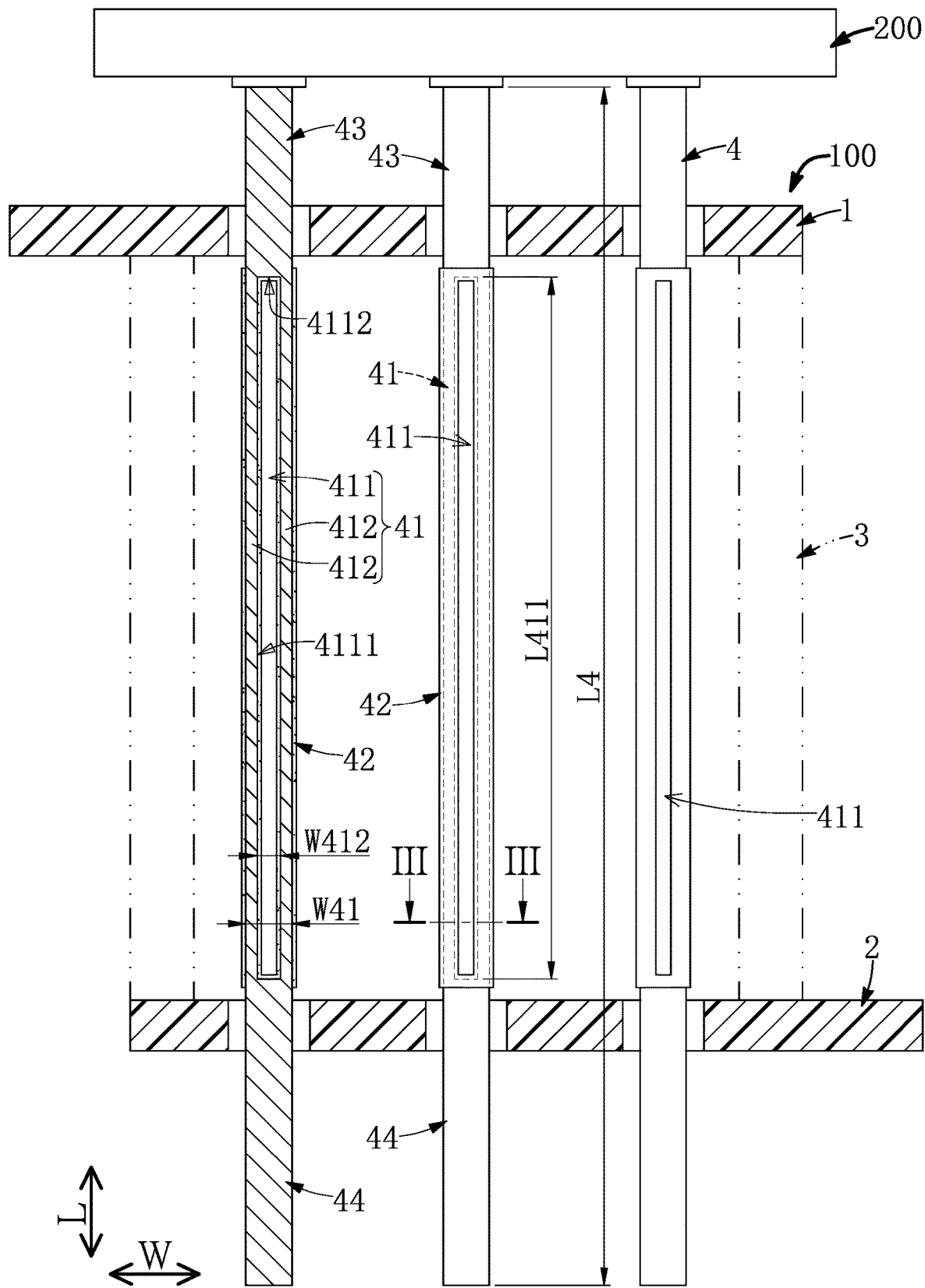
FIG. 1 is a planar view of a vertical probe card according to a first embodiment of the present disclosure.
Figure 2:
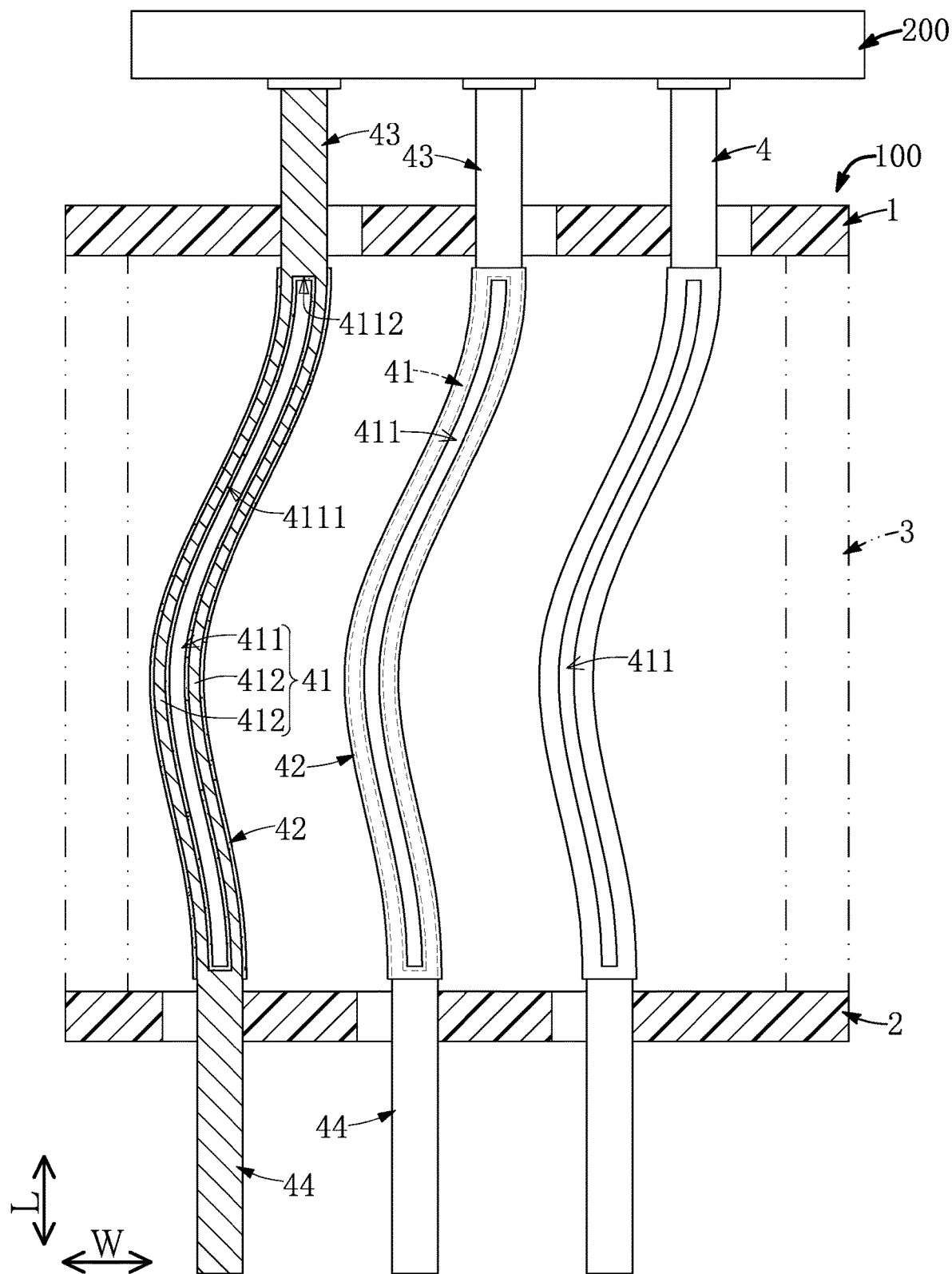
FIG. 2 is a planar view showing the vertical probe card of FIG. 1 when a first guiding board unit and a second guiding board unit are staggered with each other.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a vertical probe card, which includes a probe head 100 and a space transformer 200 that is abutted against one side of the probe head 100 (e.g., a top side of the probe head 100 shown in FIG. 1). Another side of the probe head 100 (e.g., a bottom side of the probe head 100 shown in FIG. 1) is configured to abut against a device under test (DUT) that is not shown in the drawings and that can be a semiconductor wafer.

It should be noted that in order to facilitate a better understanding of the present embodiment, the drawings only show a portion of the vertical probe card for clearly showing structural and connection relationships of each component of the vertical probe card, but the present disclosure is not limited by the drawings. The following description describes the structure and connection relationship of each component of the vertical probe card.

As shown in FIG. 1 to FIG. 5, the probe head 100 includes a first guiding board unit 1, a second guiding board unit 2 spaced apart from the first guiding board unit 1, a spacer 3 sandwiched between the first guiding board unit 1 and the second guiding board unit 2, and a plurality of fence-like probes 4 that pass through the first guiding board unit 1 and the second guiding board unit 2.

It should be noted that the fence-like probes 4 in the present embodiment are described in cooperation with the first guiding board unit 1, the second guiding board unit 2, and the spacer 3, but the present disclosure is not limited thereto. For example, in other embodiments of the present disclosure not shown in the drawings, the fence-like probe 4 can be independently used (e.g., sold) or can be used in cooperation with other components.

In the present embodiment, the first guiding board unit 1 and the second guiding board unit 2 are spaced apart from each other, the first guiding board unit 1 includes one first guiding board, and the second guiding board unit 2 includes one second guiding board. However, in other embodiments of the present disclosure not shown in the drawings, the first guiding board unit 1 can include a plurality of first guiding boards and at least one spacing sheet that is sandwiched between any two of the first guiding boards adjacent to each other, and the second guiding board unit 2 can include a plurality of second guiding boards and at least one spacing sheet that is sandwiched between any two of the second guiding boards adjacent to each other. Furthermore, the first guiding boards can be staggered with each other, the second guiding boards can be staggered with each other, and the first guiding board unit 1 and the second guiding board unit 2 can be staggered with each other.

The spacer 3 can be a ring-shaped structure sandwiched between peripheral portions of the first guiding board unit 1 and the second guiding board unit 2, but the present disclosure is not limited thereto. For example, in other embodiments of the present disclosure not shown in the drawings, the spacer 3 of the vertical probe card can be omitted or can be replaced by other components.

Moreover, the fence-like probes 3 pass through the first guiding board unit 1 and the second guiding board unit 2, and a probe length L4 of each of the fence-like probes 4 is limited to be within a range from 5 mm to 8 mm. As the fence-like probes 4 in the present embodiment are of the substantially same structure (e.g., the probe lengths L4 of the fence-like probes 4 can be the same), the following description discloses the structure of just one of the fence-like probes 4 for the sake of brevity, but the present disclosure is not limited thereto. For example, in other embodiments of the present disclosure not shown in the drawings, the fence-like probes 4 provided by the probe head 100 (or the vertical probe card) can be of different structure.

Furthermore, in order to clearly introduce the structure of the fence-like probe 4, the following description describes the structure of the fence-like probe 4 before the first guiding board unit 1 and the second guiding board unit 2 are staggered with each other.

The fence-like probe 4 is substantially in a straight shape defining a longitudinal direction L. The fence-like probe 4 includes a fence-like segment 41, a ceramic layer 42 formed on the fence-like segment 41, a connection segment 43 connected to one end of the fence-like segment 41, and a testing segment 44 that is connected to another one end of the fence-like segment 41. Specifically, the fence-like probe 4 in the present embodiment is limited to being formed with the ceramic layer 42 for replacing the conventional insulating layer made of polymer material, so that the fence-like probe 4 in the present embodiment can be provided without any polymer material. In other words, any conductive probe having polymer material is different from the fence-like probe 4 of the present embodiment.

The fence-like segment 41 has an elongated shape, and the fence-like segment 41 is located between the first guiding board unit 1 and the second guiding board unit 2. The longitudinal direction L in the present embodiment can be defined by the elongated shape of the fence-like segment

41. The fence-like segment 41 has a penetrating slot 411 that is formed along the longitudinal direction L and that has a length L411 greater than 65% of the probe length L4. The penetrating slot 411 has two long walls 4111 and two short walls 4112. The two long walls 4111 face each other and are parallel to the longitudinal direction L, and the two short walls 4112 face each other and are perpendicular to the longitudinal direction L.

In other words, the fence-like segment 41 includes two arms 412 respectively arranged at two opposite sides of the penetrating slot 411 and respectively having the two long walls 4111. Moreover, cross sections of the two arms 412 perpendicular to the longitudinal direction L have a same area, and the two arms 412 are spaced apart from each other by an adjustment distance W412 that is within a range from 10 μm to 120 μm. Specifically, the two long walls 4111 are spaced apart from each other by the adjustment distance W412 along a width direction W perpendicular to the longitudinal direction L. In other words, the adjustment distance W412 is a width of the penetrating slot 411. Furthermore, two lateral surfaces of the fence-like segment 41 arranged away from each other along the width direction W are spaced apart from each other by a probe width W41 that is within a range from 50 μm to 160 μm.

In addition, a quantity of the penetrating slot 411 formed in the fence-like segment 41 of the present embodiment is only one, and the penetrating slot 411 is substantially in a rectangular shape, but the present disclosure is not limited thereto. For example, in other embodiments of the present disclosure not shown in the drawings, the quantity of the penetrating slot 411 formed in the fence-like segment 41 can be more than one, and any one of the two long walls 4111 or any one of the two short walls 4112 of the penetrating slot 411 can be in an arced shape or other shapes.

The ceramic layer 42 is directly formed on an outer surface of the fence-like segment 41 and covers the two long walls 4111 and the two short walls 4112 of the penetrating slot 411. The ceramic layer 42 is not arranged in the first guiding board unit 1 and the second guiding board unit 2 (or, the ceramic layer 42 is not formed on the connection segment 43 and the testing segment 44), thereby preventing the ceramic layer 42 from rubbing against the first guiding board unit 1 or the second guiding board unit 2 to generate particles.

Accordingly, the structural design of the fence-like probe 4 (e.g., the probe length L4 is within a range from 5 mm to 8 mm, and the length L411 of the penetrating slot 411 is greater than 65% of the probe length L4) provided by the present embodiment can allow the ceramic layer 42 to be formed on a specific position of the fence-like segment 41 (e.g., the ceramic layer 42 is not arranged in the first guiding board unit 1 and the second guiding board unit 2) for replacing the conventional insulating layer made of polymer material, thereby effectively increasing the heat-dissipation performance of the fence-like probe 4.

In the present embodiment, results of a cross-cut test performed on the ceramic layer 42 of the fence-like probe 4 is at least class 3B under the ASTM standard. When the above condition is met, the forming manner of the ceramic layer 42 formed on the fence-like segment 41 can be adjusted or changed according to design requirements. For example, the forming technique can be in a sputtering manner, an evaporation manner, or an electroplating manner, but the present disclosure is not limited thereto.

Figure 3:
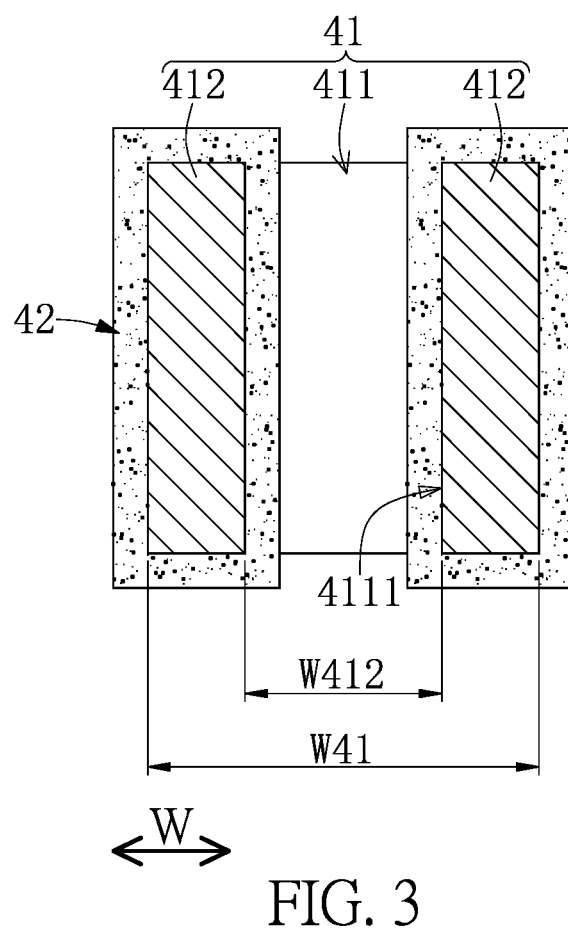
FIG. 3 is a cross-sectional view taken along a line III-III of FIG. 1.
Figure 4:
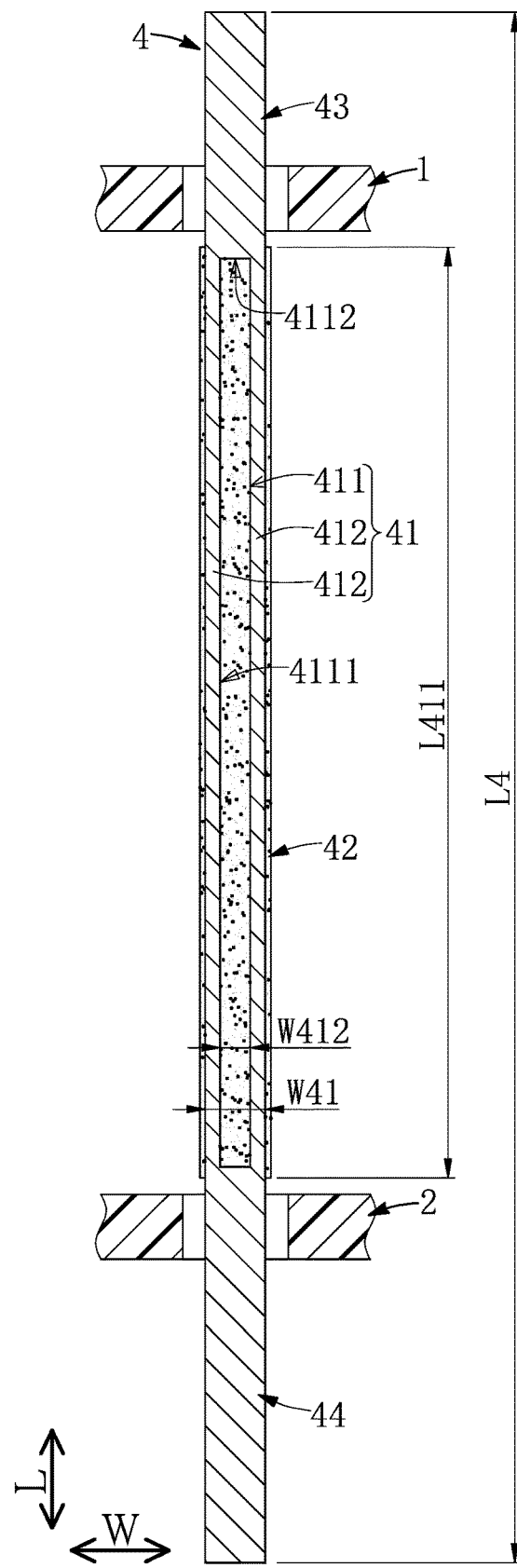
FIG. 4 is a planar view showing a fence-like probe in another configuration according to the first embodiment of the present disclosure.
Figure 5:
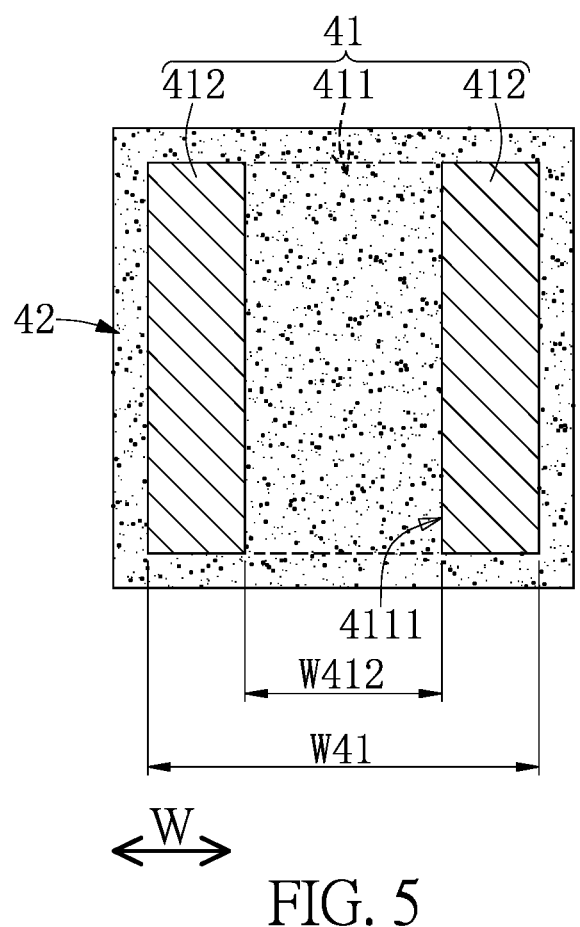
FIG. 5 is a cross-sectional view of FIG. 4.

Specifically, the ceramic layer 42 extends from a middle of the fence-like segment 41 toward the connection segment 43 and the testing segment 44, and at least 50% of the fence-like segment 41 is embedded in the ceramic layer 42. In other words, the penetrating slot 411 can be not fully filled with the ceramic layer 42 as shown in FIG. 1 and FIG. 3; or, the penetrating slot 411 can be fully filled with the ceramic layer 42 as shown in FIG. 4 and FIG. 5, so that the penetrating slot 411 is embedded in the ceramic layer 42. Furthermore, in other embodiments of the present disclosure not shown in the drawings, the ceramic layer 42 can only cover a part of each of the two long walls 4111 of the penetrating slot 411, and does not cover the two short walls 4112. The connection segment 43 and the testing segment 44 are respectively connected to two end portions of the fence-like segment 41, and respectively pass through the first guiding board unit 1 and the second guiding board unit 2. In the present embodiment, the connection segment 43 and the testing segment 44 respectively extend from the two end portions of the fence-like segment 41, thereby being jointly and integrally formed as a single one-piece structure. Moreover, the connection segment 43 is configured to fix onto the space transformer 200, and the testing segment 44 is configured to detachably abut against the DUT.

The above description describes the structure of the fence-like probe 4, and since the penetrating slot 411 is recessed in the fence-like segment 41 having a substantially rectangular cross-section, the cross section of each of the two arms 412 can be in a substantially rectangular shape, thereby facilitating control over a bending direction of the fence-like segment 41. Specifically, when the first guiding board unit 1 and the second guiding board unit 2 are staggered with each other, the fence-like segments 41 of the fence-like probes 4 can be elastically bent in a same direction.

Figure 6:
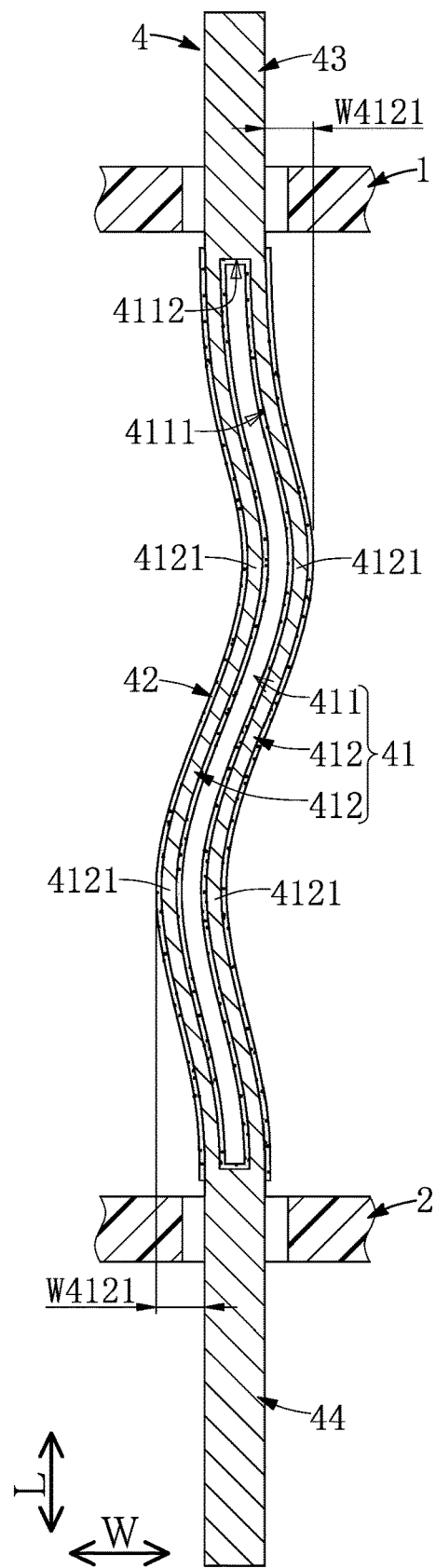
FIG. 6 is a planar view showing the fence-like probe in still another configuration according to the first embodiment of the present disclosure.

In addition, the fence-like probe 4 in the present embodiment is substantially in a straight shape, but the shape of the fence-like probe 4 can be adjusted or changed according to design requirements. For example, as shown in FIG. 6, the fence-like segment 41 of the fence-like probe 4 can be formed in a curved shape, the two arms 412 are parallel to each other, and each of the two arms 412 has two curved portions 4121 that respectively face toward two opposite directions. Along the width direction W, the connection segment 43 (or the testing segment 44) is spaced apart from an apex of one of the two curved portions 4121 adjacent thereto by a transverse distance W4121 that is within a range from 10 μm to 150 μm.

Second Embodiment

Figure 7:
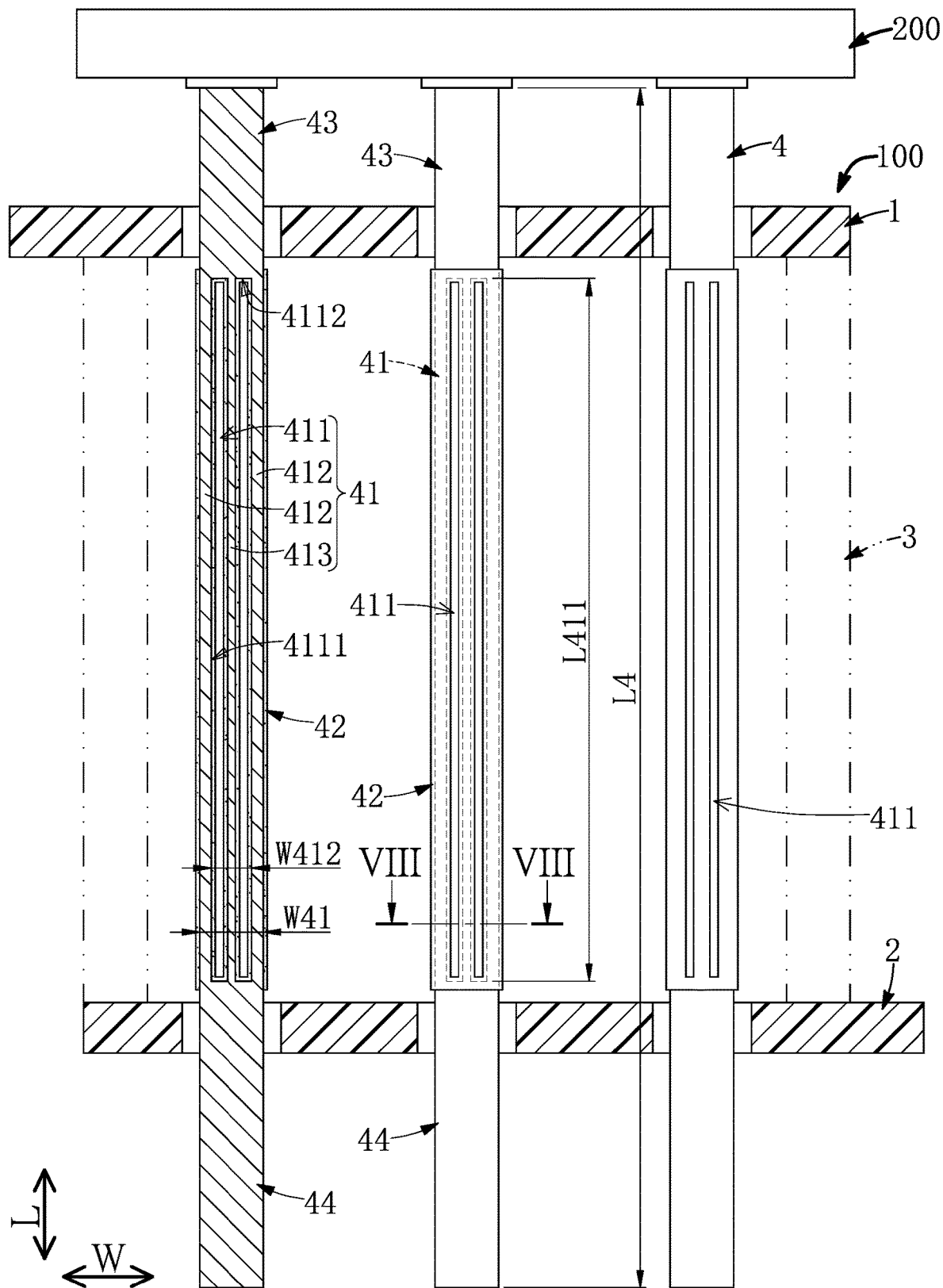
FIG. 7 is a planar view of the vertical probe card according to a second embodiment of the present disclosure.
Figure 8:
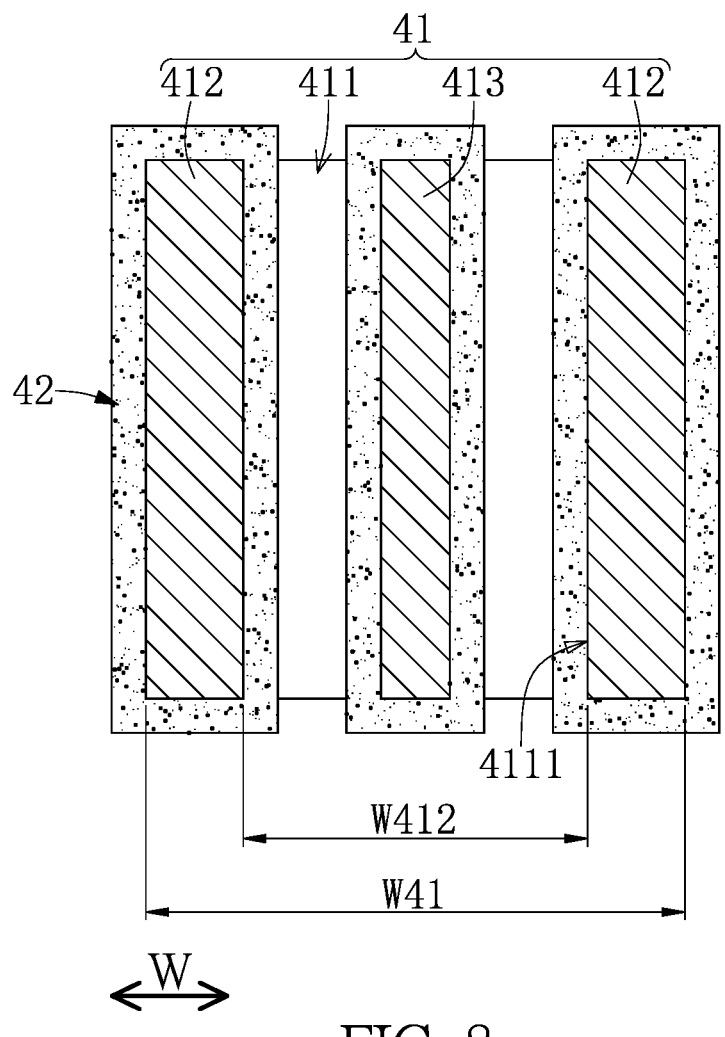
FIG. 8 is a cross-sectional view taken along a line VIII-VIII of FIG. 7.
Figure 9:
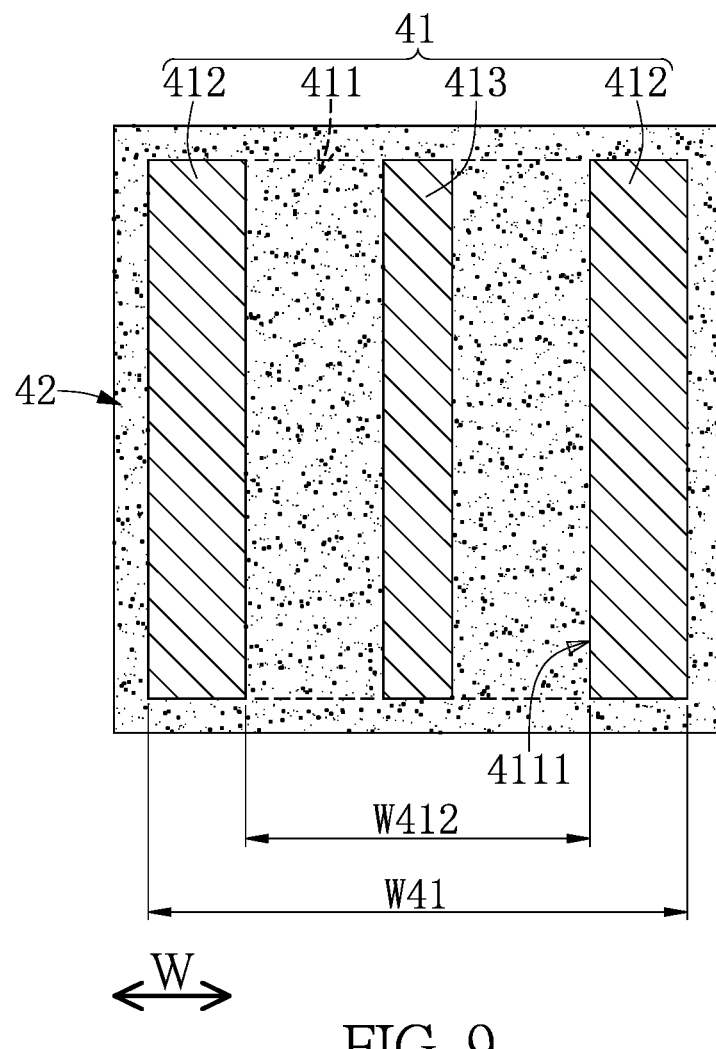
FIG. 9 is a cross-sectional view showing the fence-like probe in another configuration according to the second embodiment of the present disclosure.
Figure 10:
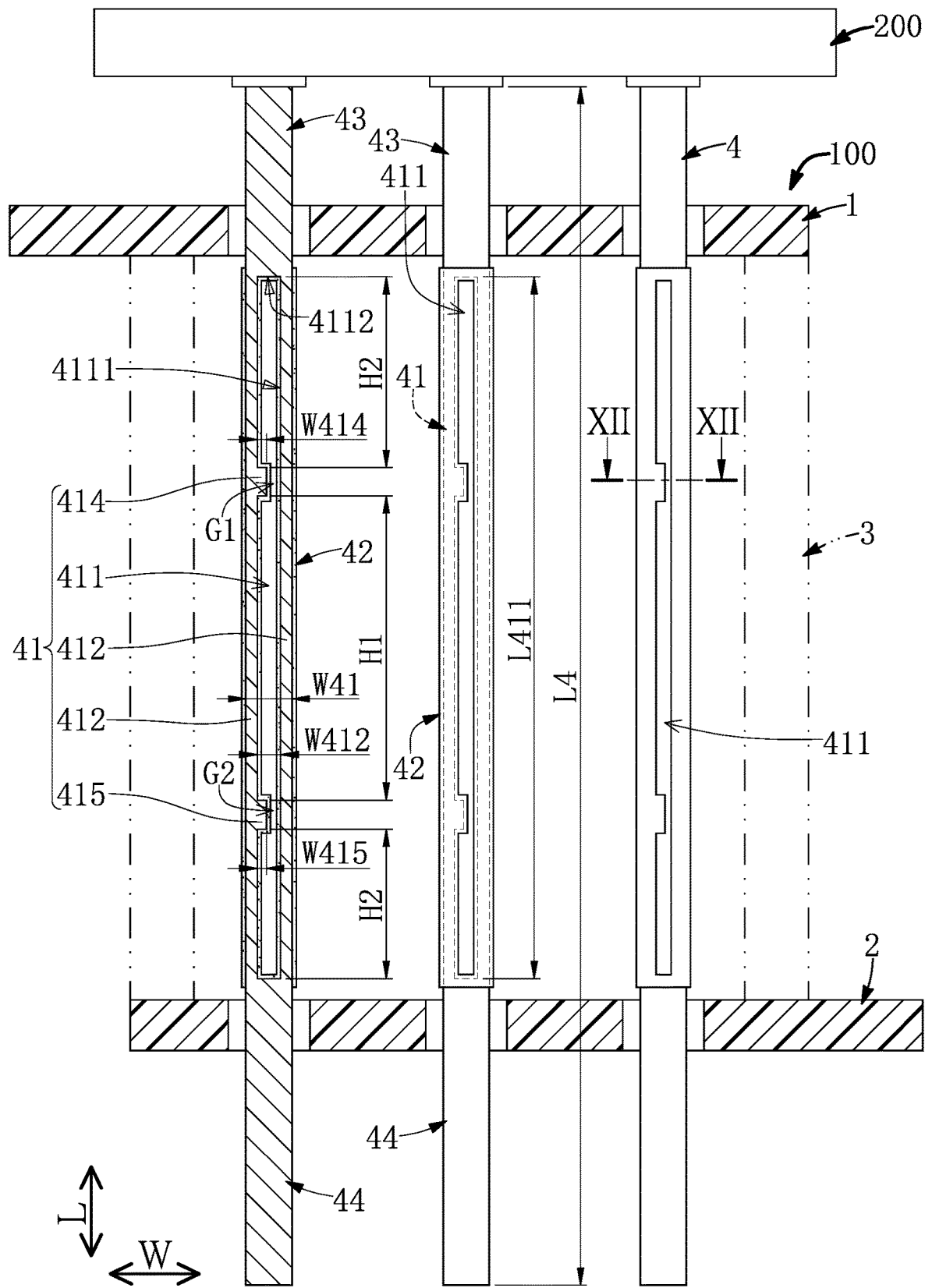
FIG. 10 is a planar view of the vertical probe card according to a third embodiment of the present disclosure.
Figure 11:
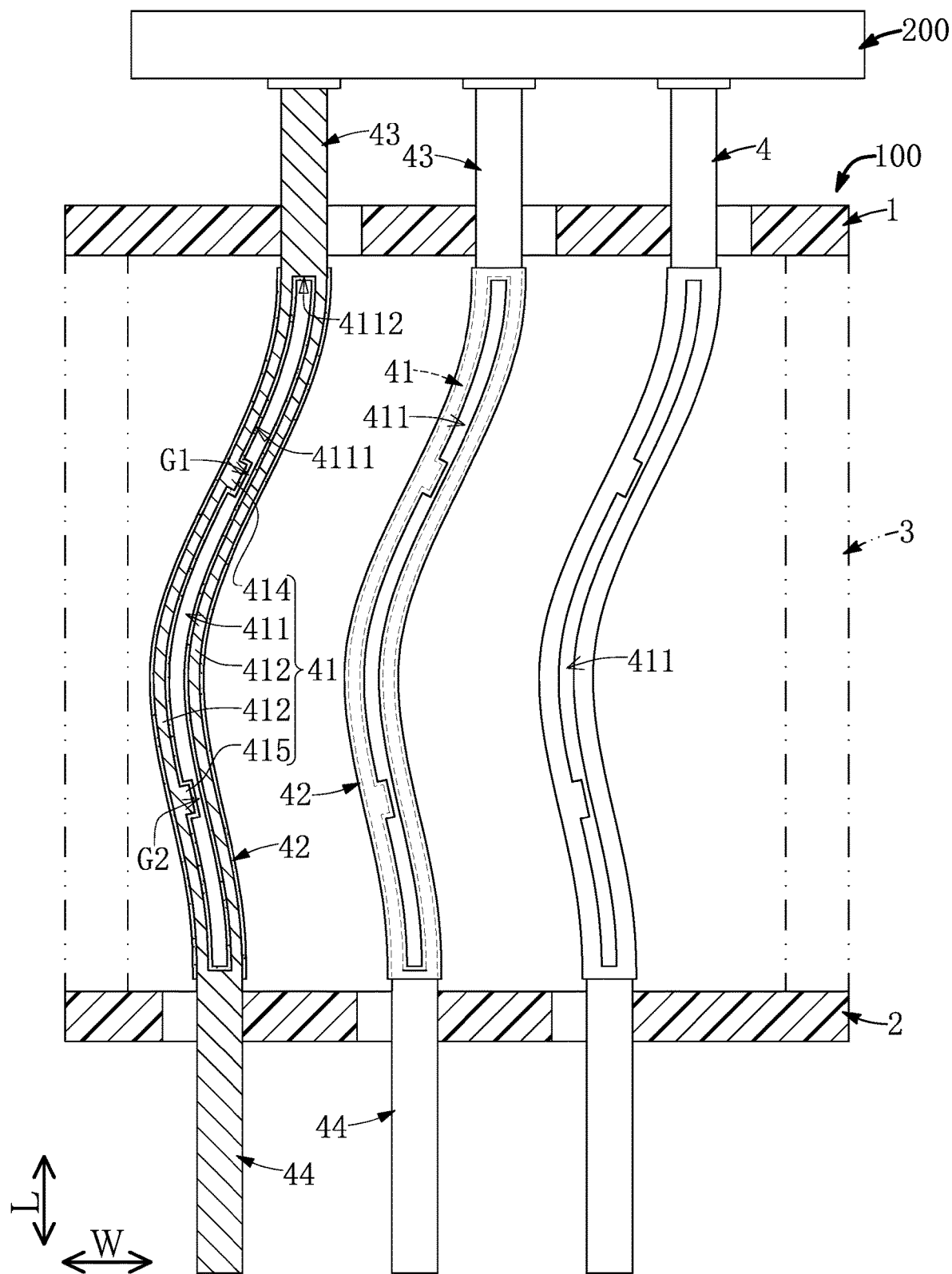
FIG. 11 is a planar view showing the vertical probe card of FIG. 10 when the first guiding board unit and the second guiding board unit are staggered with each other.

Referring to FIG. 7 to FIG. 9, a second embodiment of the present disclosure is provided, which is similar to the first embodiment of the present disclosure. For the sake of brevity, descriptions of the same components in the first and second embodiments of the present disclosure will be omitted herein, and the following description only discloses different features (e.g., the fence-like segment 41 of the fence-like probe 4) between the first and second embodiments. As the fence-like probes 4 in the present embodiment are of the substantially same structure, the following description discloses the structure of just one of the fence-like probes 4 for the sake of brevity, but the present disclosure is not limited thereto.

In the present embodiment, the fence-like segment 41 has two arms 412 and at least one inner arm 413 that is located between the two arms 412. The structural features of the two arms 412 in the present embodiment are identical to that of the first embodiment, and a quantity of the at least one inner arm 413 in the present embodiment is just one, but the present disclosure is not limited thereto.

Specifically, the at least one inner arm 413 is parallel to the longitudinal direction L or any one of the two arms 412, the at least one inner aim 413 is arranged in the penetrating slot 411, and two ends of the at least one inner arm 413 are respectively connected to the two short walls 4112 of the penetrating slot 411. Moreover, the cross-sections of the two arms 412 perpendicular to the longitudinal direction L have a same area that is different from (e.g., is less than) an area of a cross section of the at least one inner arm 413 perpendicular to the longitudinal direction L.

In other words, the penetrating slot 411 can be not fully filled with the ceramic layer 42 as shown in FIG. 8; or, the penetrating slot 411 can be fully filled with the ceramic layer 42 as shown in FIG. 9, so that the two arms 412 and the at least one inner arm 413 are embedded in the ceramic layer 42, but the present disclosure is not limited thereto.

Third Embodiment

Referring to FIG. 10 to FIG. 14, a third embodiment of the present disclosure is provided, which is similar to the first embodiment of the present disclosure. For the sake of brevity, descriptions of the same components in the first and third embodiments of the present disclosure will be omitted herein, and the following description only discloses different features (e.g., the fence-like segment 41 of the fence-like probe 4) between the first and second embodiments. As the fence-like probes 4 in the present embodiment are of the substantially same structure, the following description discloses the structure of just one of the fence-like probes 4 for the sake of brevity, but the present disclosure is not limited thereto.

In the present embodiment, the probe length L4 of the fence-like probe 4 is further limited to being within a range from 6 mm to 8 mm, and the fence-like probe 4 has a first protrusion 414 and a second protrusion 415 that is spaced apart from the first protrusion 414 along the longitudinal direction L. The first protrusion 414 extends from one of two long walls 4111 of the penetrating slot 411 along the width direction W by a first predetermined width W414, and is spaced apart from another one of the two long walls 4111 of the penetrating slot 411 by a first gap G1. Moreover, the second protrusion 415 extends from one of the two long walls 4111 of the penetrating slot 411 along the width direction W by a second predetermined width W415, and is spaced apart from another one of the two long walls 4111 of the penetrating slot 411 by a second gap G2.

Specifically, each of the first predetermined width W414 and the second predetermined width W415 is preferably within a range from 10% to 90% of the adjustment distance W412 between the two long walls 4111, and is within a range from 5 μm to 10 μm. The first predetermined width W414 and the second predetermined width W415 in the present embodiment have a same value, so that a width of the first gap G1 is equal to a width of the second gap G2, but the present disclosure is not limited thereto. For example, in other embodiments of the present disclosure not shown in the drawings, the first predetermined width W414 can be different from the second predetermined width W415.

Moreover, the first protrusion 414 and the second protrusion 415 in the present embodiment have a substantially same shape (e.g., a rectangular shape), but the shape of the first protrusion 414 or the second protrusion 415 can be adjusted or changed according to design requirements (e.g., a square shape, a trapezoid shape, or a semicircle shape) and is not limited by the drawings of the present embodiment.

Specifically, the first protrusion 414 and the second protrusion 415 are spaced apart from each other along the longitudinal direction L by a first distance H1, the first protrusion 414 and the second protrusion 415 are respectively arranged adjacent to the two short walls 4112 of the penetrating slot 411 by a same interval, and each of the first protrusion 414 and the second protrusion 415 is spaced apart from the corresponding short wall 4112 adjacent thereto by a second distance H2 that is less than or equal to the first distance H1.

Figure 12:
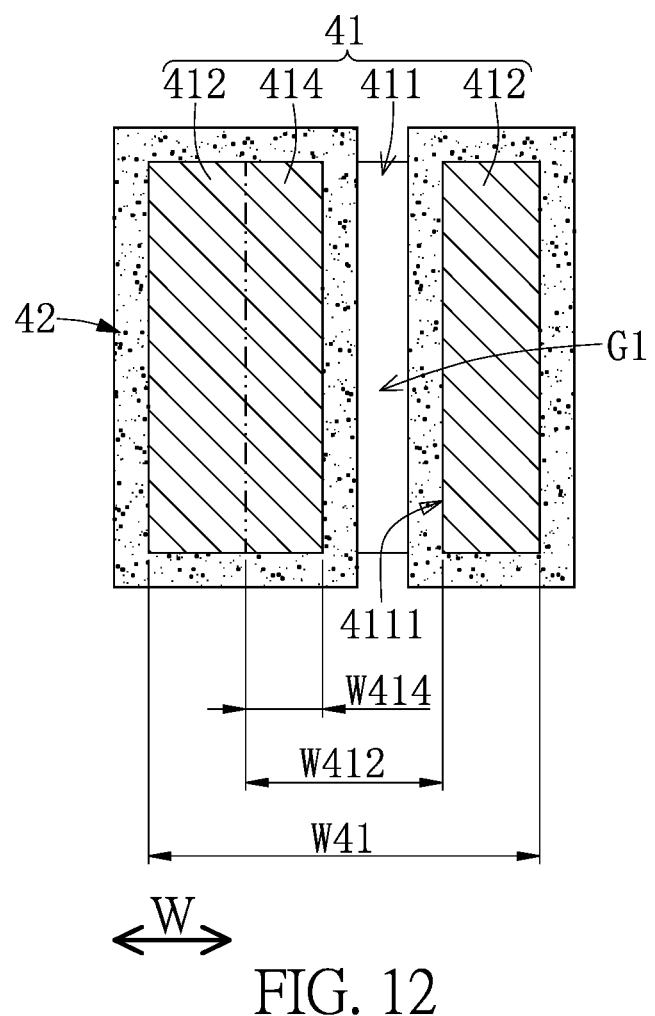
FIG. 12 is a cross-sectional view taken along a line XII-XII of FIG. 10.
Figure 13:
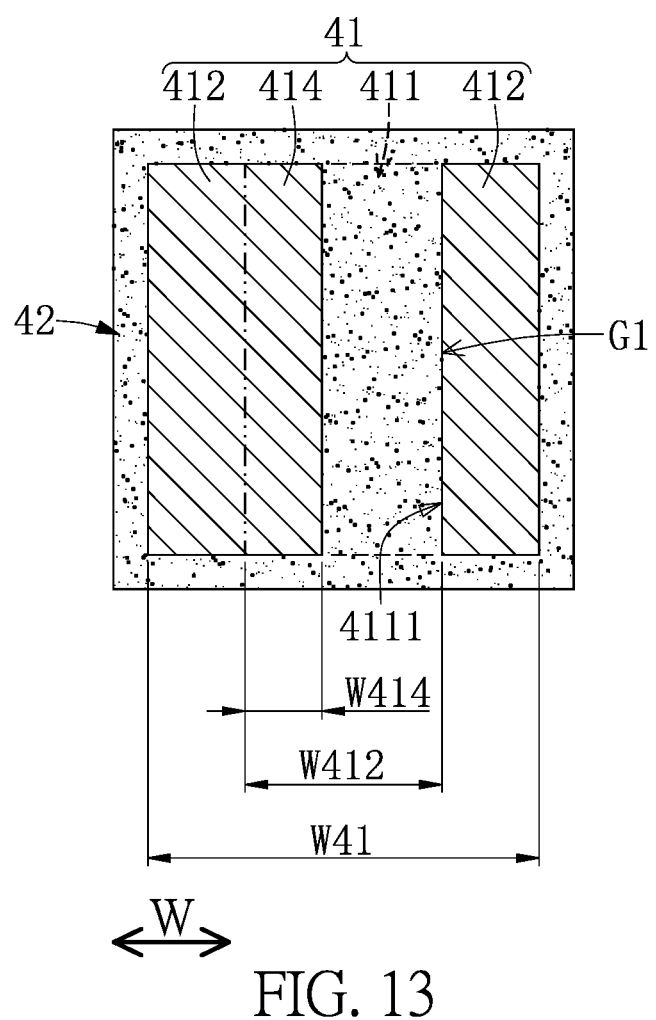
FIG. 13 is a cross-sectional view showing the fence-like probe in another configuration according to the third embodiment of the present disclosure.

In addition, the ceramic layer 42 can extend from a middle of the fence-like segment 41 toward the first protrusion 414 and the second protrusion 415, and is filled in the first gap G1 and the second gap G2. Moreover, the penetrating slot 411 can be not fully filled with the ceramic layer 42 as shown in FIG. 12; or, the penetrating slot 411 can be fully filled with the ceramic layer 42 as shown in FIG. 13, so that the penetrating slot 411, the first protrusion 414, and the second protrusion 415 are embedded in the ceramic layer 42, but the present disclosure is not limited thereto.

Figure 14:
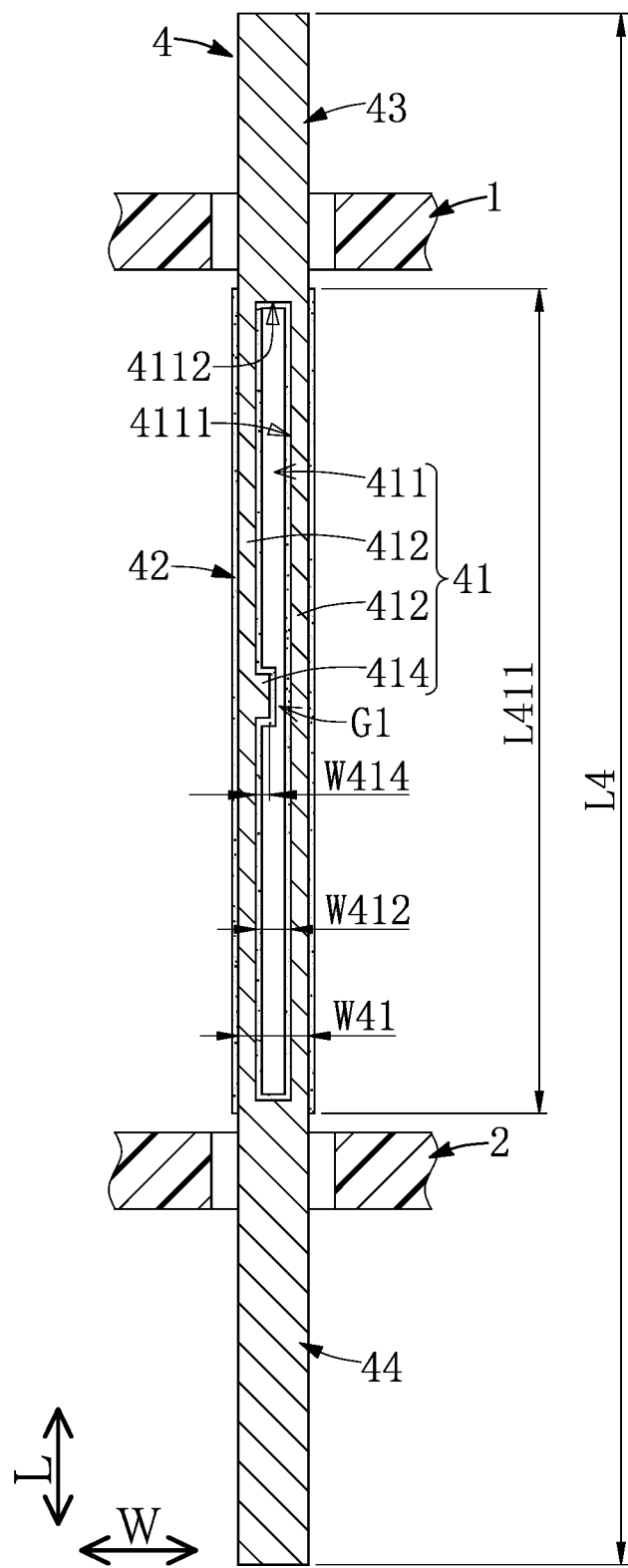
FIG. 14 is a planar view showing the fence-like probe in still another configuration according to the third embodiment of the present disclosure.

For example, as shown in FIG. 14, when the probe length L4 of the fence-like probe 4 is less than 6 mm, the second protrusion 415 should be omitted, the first protrusion 414 substantially extends from a middle of one of the two long walls 4111 along the width direction W, the penetrating slot 411 can be fully filled with the ceramic layer 42, and the penetrating slot 411 and the first protrusion 414 are embedded in the ceramic layer 42.

The above description describes the structure of the fence-like probe 4, and since the penetrating slot 411 is recessed in the fence-like segment 41 having a substantially rectangular cross-section, the cross section of each of the two arms 412 can be in a substantially rectangular shape, thereby facilitating control over a bending direction of the fence-like segment 41. Specifically, when the first guiding board unit 1 and the second guiding board unit 2 are staggered with each other, the fence-like segments 41 of the fence-like probes 4 can be elastically bent in a same direction, one of the two long walls 4111 is located at an outer side of another one of the two long walls 4111 and extends to form the first protrusion 414 and the second protrusion 415.

In other words, in each of the fence-like probes 4, the first protrusion 414 and the second protrusion 415 are preferably formed on the long wall 4111 located at the outer side, thereby avoiding excessive concentration of stress, but the present disclosure is not limited thereto. For example, in other embodiments of the present disclosure not shown in the drawings, the first protrusion 414 and the second protrusion 415 of any one of the fence-like probes 4 can be respectively formed on the two long walls 4111.

In summary, the structural design of the fence-like probe 4 (e.g., the probe length L4 is within a range from 5 mm to 8 mm, and the length L411 of the penetrating slot 411 is greater than 65% of the probe length L4) provided by the present embodiment is in cooperation with the first protrusion 414 arranged in the penetrating slot 411, so that the fence-like segment 41 of the fence-like probe 4 can have a smaller deformation through the first protrusion 414 when being operated, thereby maintaining the structural and electrical performance of the fence-like probe 4.

Specifically, when the probe length L4 of the fence-like probe 4 is within a range from 6 mm to 8 mm, the penetrating slot 411 is preferably provided with the second protrusion 415 therein, and the second protrusion 415 and the first protrusion 414 can have a specific relationship (e.g., the second distance H2 is less than or equal to the first distance H1), thereby effectively maintaining the structural and electrical performance of the fence-like probe 4.

In addition, the vertical probe card in the present embodiment can be referred to as a vertical probe card device. Moreover, the ceramic layer 42 of each of the fence-like probes 4 in the present embodiment can be omitted or can be replaced by other materials (e.g., silicon carbide, aluminum nitride, aluminum oxide, silicon nitride, or other insulating materials with high heat-dissipation and high voltage resistance) according to design requirements.

Fourth Embodiment

Figure 15:
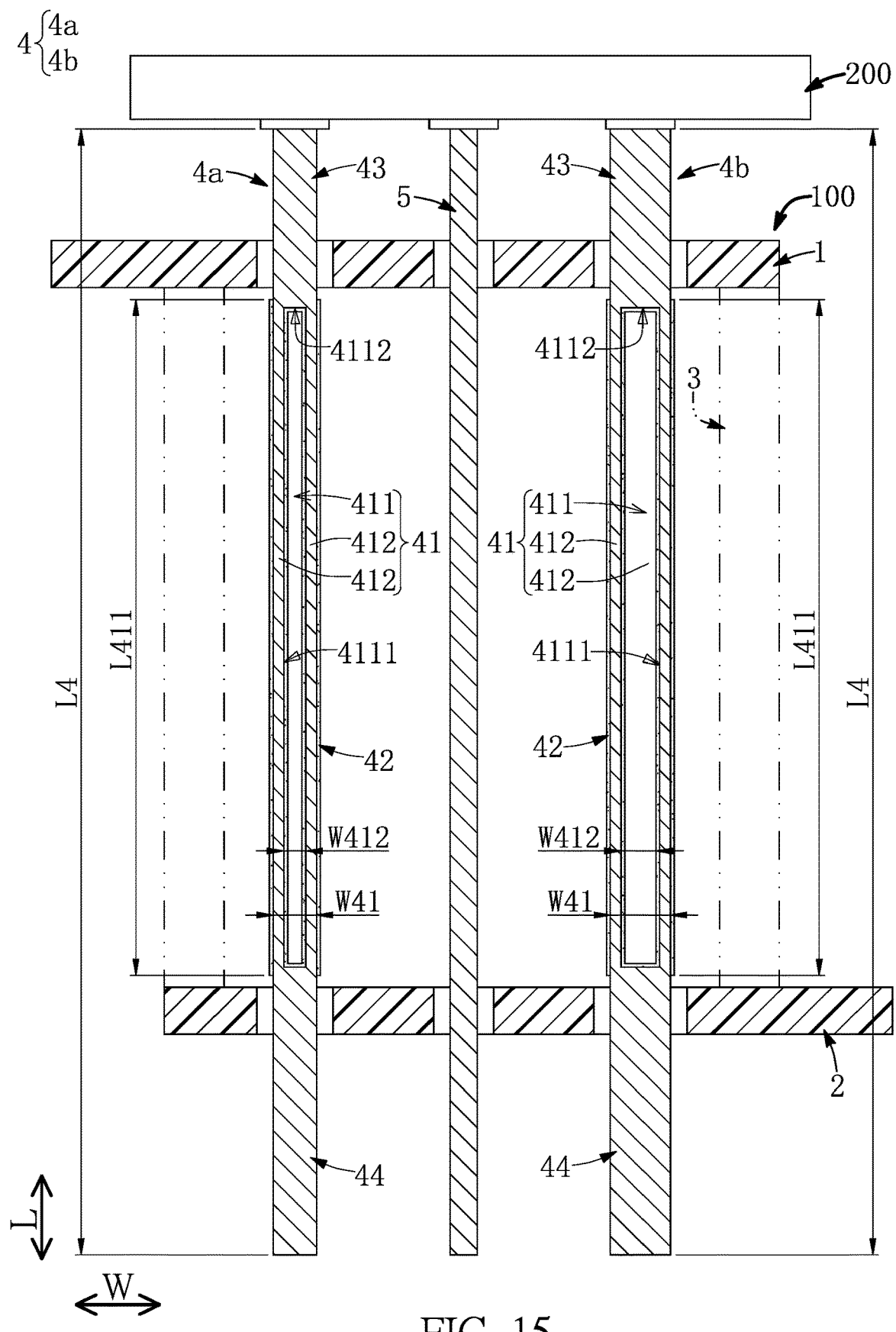
FIG. 15 is a planar view of the vertical probe card according to a fourth embodiment of the present disclosure.
Figure 16:
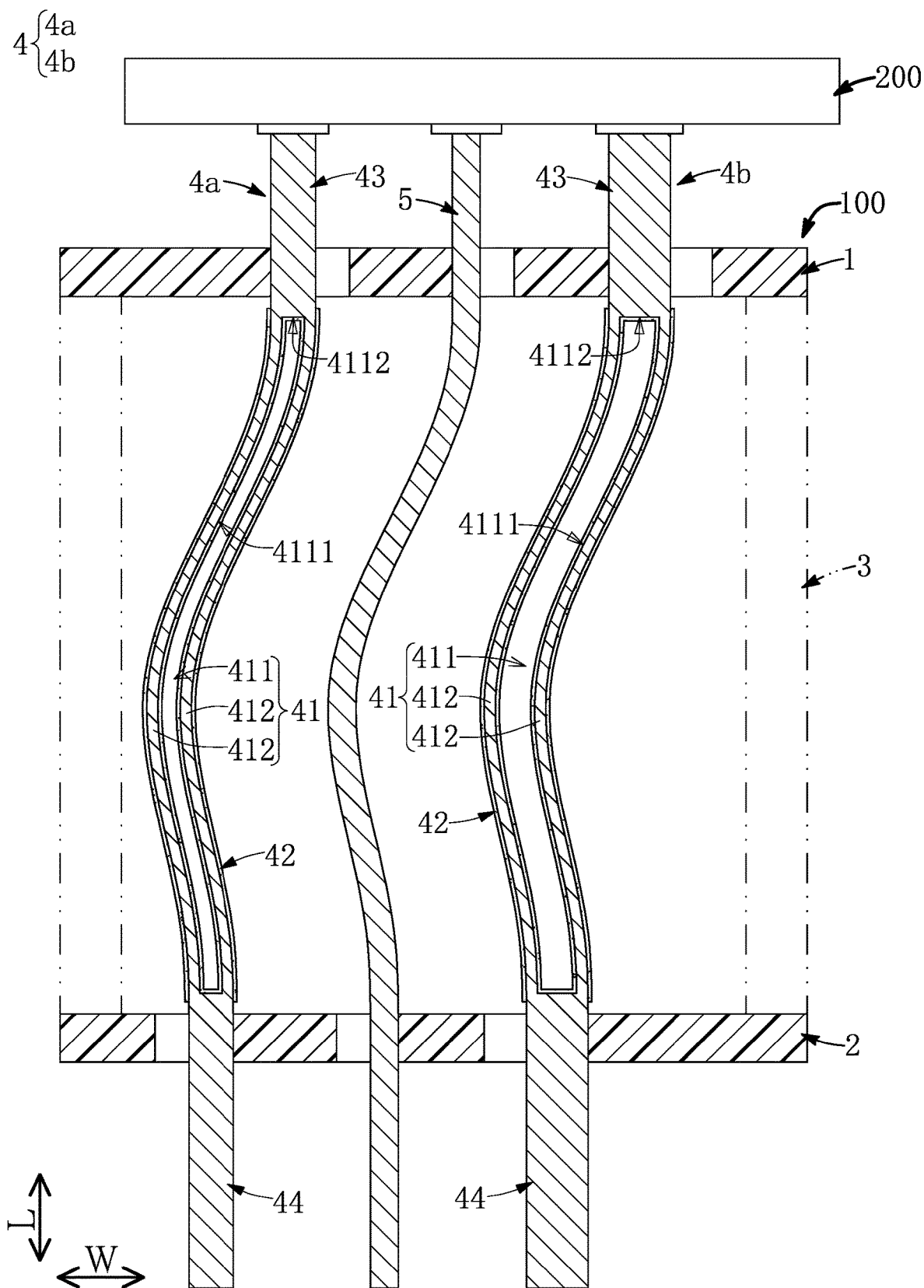
FIG. 16 is a planar view showing the vertical probe card of FIG. 15 when the first guiding board unit and the second guiding board unit are staggered with each other.

Referring to FIG. 15 and FIG. 16, a fourth embodiment of the present disclosure is provided, which is similar to the above first to third embodiments of the present disclosure. For the sake of brevity, descriptions of the same components in the first to fourth embodiments of the present disclosure will be omitted herein, and the following description only discloses different features between the fourth embodiment and the above first to third embodiments. For example, the fence-like probes 4 in the present embodiment can be of different structure, and when the first guiding board unit 1 and the second guiding board unit 2 are staggered with each other, the fence-like segments 41 of the fence-like probes 4 preferably still bend elastically in a same direction.

Specifically, the fence-like probes 4 in the present embodiment have a same contact force, and include a first probe 4a and a second probe 4b, which are configured to respectively meet different electrical transmission requirements. Moreover, a minimum cross-sectional area of the fence-like segment 41 of the first probe 4a is equal to a minimum cross-sectional area of the fence-like segment 41 of the second probe 4b, and a shape of the penetrating slot 411 of the first probe 4a is different from a shape of the penetrating slot 411 of the second probe 4b. That is to say, in the first probe 4a and the second probe 4b, the minimum cross sections of the fence-like segments 41 have a same area, and the shapes of the penetrating slots 411 are different from each other. In the present embodiment, the adjustment distance W412 of the first probe 4a is less than the adjustment distance W412 of the second probe 4b, but the present disclosure is not limited thereto. For example, in other embodiments of the present disclosure not shown in the drawings, the penetrating slot 411 of the first probe 4a can be different from the penetrating slot 411 of the second probe 4b in length or contour.

Furthermore, each of the fence-like probes 4 in the present embodiment has structural designs that are the same as the structural design of the fence-like probe 4 described in the first to third embodiments, but the fence-like probes 4 in the present embodiment (e.g., the first probe 4a and the second probe 4b) can be used to meet different electrical transmission requirements through shape designs of the penetrating slots 411 thereof.

Specifically, the electrical transmission requirements include two different signal transmission requirements, and the penetrating slots 411 of the first probe 4a and the second probe 4b are formed in different shapes according to the two different signal transmission requirements, thereby achieving impedance matching. Or, the electrical transmission requirements include two different current transmission requirements, and the penetrating slots 411 of the first probe 4a and the second probe 4b are formed in different shapes according to the two different current transmission requirements, thereby having load current values respectively corresponding to the two different current transmission requirements.

Specifically, the first probe 4a and the second probe 4b in the present embodiment can be provided as shown in FIG. 15, but the present disclosure is not limited thereto. For example, the first probe 4a can be formed as the fence-like probe 4 described in the first embodiment or the third embodiment, and the second probe 4b can be formed as the fence-like probe 4 described in the second embodiment.

It should be noted that the first probe 4a and the second probe 4a in the present embodiment can further be in cooperation with a rectangular probe provided without any thru-hole. The rectangular probe 5 has a contact force equal to that of the first probe 4a (or the second probe 4b), thereby being capable of meeting more electrical transmission requirements.

Moreover, along a direction perpendicular to the longitudinal direction L, a cross-sectional area of the rectangular probe 5 is equal to the minimum cross-sectional area of the fence-like segment 41 (e.g., the two arms 412) of the first probe 4a, and is also equal to the minimum cross-sectional area of the fence-like segment 41 (e.g., the two arms 412 and the at least one inner arm 413) of the second probe 4b, but external surface areas of the first probe 4a, the second probe 4b, and the rectangular probe 5 are different from each other. For example, the cross-sectional area of the rectangular probe 5 is equal to the minimum cross-sectional areas of the two arms 412 of the first probe 4a, and is also equal to the minimum cross-sectional area of the two arms 412 and the at least one inner arm 413 (as shown in FIG. 7 to FIG. 9 of the second embodiment) of the second probe 4b.

In addition, the vertical probe card in the present embodiment can be referred to as a multi-probe vertical probe card having different probes. Moreover, the ceramic layer 42 of each of the fence-like probes 4 in the present embodiment can be omitted or can be replaced by other materials (e.g., silicon carbide, aluminum nitride, aluminum oxide, silicon nitride, or other insulating materials with high heat-dissipation and high voltage resistance) according to design requirements.

In summary, the fence-like probes 4 have structural designs that can allow the penetrating slots to change their shape within the adjustment distance to meet different electrical transmission requirements (e.g., through having the probe length L4 being within a range from 5 mm to 8 mm, the length L411 of the penetrating slot 411 being greater than 65% of the probe length L4, and the minimum cross-sectional area of the fence-like segment 41 of the first probe 4a being equal to that of the second probe 4b), thereby effectively decreasing the testing time of the vertical probe card.

Beneficial Effects of the Embodiments

In conclusion, the structural design of the fence-like probe (e.g., the probe length is within a range from 5 mm to 8 mm, and the length of the penetrating slot is greater than 65% of the probe length) provided by the present disclosure can allow the ceramic layer to be formed on a specific position of the fence-like segment (e.g., the ceramic layer is not arranged in the first guiding board unit and the second guiding board unit) for replacing the conventional insulating layer made of polymer material, thereby effectively increasing the heat-dissipation performance of the fence-like probe.

Moreover, the structural design of the fence-like probe (e.g., the probe length is within a range from 5 mm to 8 mm, and the length of the penetrating slot is greater than 65% of the probe length) provided by the present disclosure is in cooperation with the first protrusion arranged in the penetrating slot, so that the fence-like segment of the fence-like probe can have a smaller deformation through the first protrusion when being operated, thereby maintaining the structural and electrical performance of the fence-like probe.

In addition, the fence-like probes have structural designs that can allow the penetrating slots to change their shape within the adjustment distance to meet different electrical transmission requirements (e.g., through having the probe length being within a range from 5 mm to 8 mm, the length of the penetrating slot being greater than 65% of the probe length, and the minimum cross-sectional area of the fence-like segment of the first probe being equal to that of the second probe), thereby effectively decreasing the testing time of the vertical probe card.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A vertical probe card having different probes, comprising:
   a first guiding board unit and a second guiding board unit that is spaced apart from the first guiding board unit; and
   a plurality of fence-like probes passing through the first guiding board unit and the second guiding board unit, wherein each of the fence-like probes has a probe length within a range from 5 mm to 8 mm, and each of the fence-like probes includes:
      a fence-like segment having an elongated shape defining a longitudinal direction, wherein the fence-like segment includes a penetrating slot formed along the longitudinal direction and having a length greater than 65% of the probe length, and wherein the fence-like segment includes two arms that are respectively arranged at two opposite sides of the penetrating slot and that are spaced apart from each other by an adjustment distance within a range from 10 μm to 120 μm; and
      a connection segment and a testing segment that are respectively connected to two end portions of the fence-like segment and that respectively pass through the first guiding board unit and the second guiding board unit;
   wherein the fence-like probes have a same contact force and include a first probe and a second probe, and wherein the first probe and the second probe are configured to respectively meet different electrical transmission requirements, a minimum cross-sectional area of the fence-like segment of the first probe is equal to a minimum cross-sectional area of the fence-like segment of the second probe, and a shape of the penetrating slot of the first probe is different from a shape of the penetrating slot of the second probe;
   wherein, in the first probe, the fence-like segment has a first protrusion extending from one of two long walls of the penetrating slot by a first predetermined width and spaced apart from another one of the two long walls of the penetrating slot by a first gap;
   wherein, in the first probe, the fence-like segment includes a second protrusion that extends from one of the two long walls of the penetrating slot by a second predetermined width and that is spaced apart from another one of the two long walls of the penetrating slot by a second gap.

2. The vertical probe card according to claim 1, wherein, when the first guiding board unit and the second guiding board unit are staggered with each other, the fence-like segments of the fence-like probes elastically bend in a same direction.

3. The vertical probe card according to claim 1, wherein the adjustment distance of the first probe is less than the adjustment distance of the second probe.

4. The vertical probe card according to claim 3, wherein the fence-like segment of the second probe includes at least one inner arm arranged in the penetrating slot thereof, and two ends of the at least one inner arm are respectively connected to two short walls of the penetrating slot, and wherein a sum of minimum cross-sectional areas of the two arms of the first probe is equal to a sum of minimum cross-sectional areas of the two arms and the at least one inner arm of the second probe.

5. The vertical probe card according to claim 3, wherein the probe lengths of the fence-like probes are the same, and wherein in the first probe, the two arms are parallel to each other, and each of the two arms has two curved portions respectively facing toward two opposite directions.

6. The vertical probe card according to claim 1, wherein, in the first probe, the probe length is further limited to being within a range from 6 mm to 8 mm.

7. The vertical probe card according to claim 6, wherein, when the first guiding board unit and the second guiding board unit are staggered with each other, one of the two long walls is located at an outer side of another one of the two long walls and extends to form the first protrusion the second protrusion.

8. The vertical probe card according to claim 6, wherein, in the first probe, the first protrusion and the second protrusion are spaced apart from each other along the longitudinal direction by a first distance, the first protrusion and the second protrusion are respectively arranged adjacent to two short walls of the penetrating slot by a same interval, and each of the first protrusion and the second protrusion is spaced apart from the corresponding short wall by a second distance that is less than or equal to the first distance.

9. The vertical probe card according to claim 1, wherein each of the fence-like probes includes a ceramic layer that is directly formed on an outer surface of the fence-like segment, that covers two long walls of the penetrating slot, and that is not arranged in the first guiding board unit and the second guiding board unit, and wherein a cross-cut test result of the ceramic layer of each of the fence-like probes is at least class 3B under the ASTM standard.

* * * * *